(12) United States Patent
Park

(10) Patent No.: US 9,869,436 B2
(45) Date of Patent: Jan. 16, 2018

(54) CANDLE-POWERED LIGHTING APPARATUS

(71) Applicant: LUMIR INC., Seoul (KR)

(72) Inventor: Je Hwan Park, Seoul (KR)

(73) Assignee: LUMIR INC., Seoul (KR)

( * ) Notice: Subject to any disclaimer, the term of this patent is extended or adjusted under 35 U.S.C. 154(b) by 95 days.

(21) Appl. No.: 14/888,423

(22) PCT Filed: Aug. 5, 2015

(86) PCT No.: PCT/KR2015/008216
§ 371 (c)(1),
(2) Date: Oct. 30, 2015

(87) PCT Pub. No.: WO2016/047919
PCT Pub. Date: Mar. 31, 2016

(65) Prior Publication Data
US 2016/0298814 A1    Oct. 13, 2016

(30) Foreign Application Priority Data
Sep. 22, 2014  (KR) .................. 10-2014-0126027

(51) Int. Cl.
*F21V 35/00* (2006.01)
*F21S 9/04* (2006.01)
(Continued)

(52) U.S. Cl.
CPC ................ *F21S 9/04* (2013.01); *F21S 6/002* (2013.01); *F21V 15/01* (2013.01);
(Continued)

(58) Field of Classification Search
CPC .... F21L 19/00; F21L 27/00; F21S 9/04; F21S 15/00; F21V 23/003; F21V 23/0485;
(Continued)

(56) References Cited

U.S. PATENT DOCUMENTS 6,716,026 B1 *  4/2004  Beougher ............... F21V 35/00
                                                      431/290
7,862,397 B1 *  1/2011  Ng .......................... A63H 29/16
                                                       40/411
(Continued)

FOREIGN PATENT DOCUMENTS

CN         201219247 Y  *  4/2009
CN         201742345 U  *  2/2011
(Continued)

*Primary Examiner* — Hargobind S Sawhney
(74) *Attorney, Agent, or Firm* — Studebaker & Brackett PC

(57) ABSTRACT

The present invention relates to a candle-powered lighting apparatus including: a housing which accommodates a candle; a heat absorbing plate which absorbs heat generated by the candle; a heat radiating plate which radiates the absorbed heat; a thermoelectric element which is positioned between the heat absorbing plate and the heat radiating plate, and generates thermoelectromotive force using a temperature difference between a contact surface with the heat absorbing plate and a contact surface with the heat radiating plate; a lighting unit which emits light using the generated thermoelectromotive force; and a control unit which controls an operational state of the lighting unit to an on or off state.

11 Claims, 5 Drawing Sheets

(51) Int. Cl.
*F21V 29/56* (2015.01)
*F21S 6/00* (2006.01)
*F21V 15/01* (2006.01)
*F21V 23/04* (2006.01)
*F21V 25/04* (2006.01)
*H01L 35/30* (2006.01)
*F21V 37/00* (2006.01)
*F21V 29/54* (2015.01)
*F21V 29/67* (2015.01)
*F21V 23/00* (2015.01)
*F21S 9/02* (2006.01)
*F21Y 115/10* (2016.01)
*F21Y 113/20* (2016.01)

(52) U.S. Cl.
CPC ...... *F21V 23/0457* (2013.01); *F21V 23/0485* (2013.01); *F21V 25/04* (2013.01); *F21V 29/54* (2015.01); *F21V 29/56* (2015.01); *F21V 35/00* (2013.01); *F21V 37/00* (2013.01); *H01L 35/30* (2013.01); *F21S 9/02* (2013.01); *F21V 23/003* (2013.01); *F21V 23/005* (2013.01); *F21V 29/67* (2015.01); *F21Y 2113/20* (2016.08); *F21Y 2115/10* (2016.08)

(58) Field of Classification Search
CPC .......... F21V 29/54; F21V 35/00; F21V 37/00; F21V 15/01; F21V 23/0457; F21V 37/002; H01L 35/00; H01L 35/02; H01L 35/28; H01L 35/30; H01L 35/32; H02N 11/00
See application file for complete search history.

(56) References Cited

U.S. PATENT DOCUMENTS

| | | | |
|---|---|---|---|
| 2002/0070633 A1* | 6/2002 | Salender | H01L 35/00 310/306 |
| 2004/0252499 A1* | 12/2004 | Tumlinson | F21S 6/007 362/228 |
| 2013/0050995 A1* | 2/2013 | Hsu | F21S 9/04 362/181 |
| 2014/0069477 A1* | 3/2014 | Haider | H01L 35/30 136/205 |

FOREIGN PATENT DOCUMENTS

| | | | | |
|---|---|---|---|---|
| JP | 01050303 A | * | 2/1989 | |
| JP | 01050775 A | | 2/1989 | |
| JP | 2013045929 A | * | 3/2013 | ......... F28D 15/0275 |
| KR | 1020140073704 A | | 6/2014 | |

* cited by examiner

CANDLE-POWERED LIGHTING APPARATUS

TECHNICAL FIELD

This application claims priority to and the benefit of Korean Patent Application No. 10-2014-0126027 filed on Sep. 22, 2014, the entire contents of which are incorporated herein by reference.

The present invention relates to a candle-powered lighting apparatus, and more particularly, to a candle-powered lighting apparatus which is provided with a thermoelectric element between a heat absorbing plate, which absorbs heat generated by a candle, and a heat radiating plate, which radiates the absorbed heat, generates thermoelectromotive force using a temperature difference between a contact surface with the heat absorbing plate and a contact surface with the heat radiating plate, emits light using a lighting unit by converting the generated thermoelectromotive force into a constant current at direct current voltage, controls an operational state of the lighting unit based on a result of measuring luminous intensity of a flame of the candle and an inclination of the candle or the lighting apparatus, and maintains a constant distance between an uppermost side of the candle and the heat absorbing plate using a distance measurement sensor and a candle moving unit.

BACKGROUND ART

At present, while electric power is smoothly supplied for 24 hours in countries with electric power distribution systems, electric power is still not available in the developing countries of Africa and Asia, and about 25% of the world's population do not have access to electric power.

The developing countries of Africa and Asia, which do not have access to electric power, use kerosene as a major energy source, for example, for brightening the darkness using kerosene lamps instead of electric power.

The use of the kerosene lamp in a closed room not only causes respiratory diseases due to emission of hazardous gas, but also always exposes the user to the risk of fire.

In addition, in low-income developing countries of Africa and Asia, the kerosene lamps cannot be used for a long time because the kerosene price is high, and a portion of money paid for kerosene actually takes away from any income earned.

Therefore, the user brightens the darkness using a candle instead of the kerosene lamp, which is expensive, emits hazardous gas, and brings the risk of fire, but there is a problem in that luminous intensity of a flame is insufficient for the user to use daily by only using the flame of the candle.

The present invention relates to a candle-powered lighting apparatus which is provided with a thermoelectric element, which uses the Seebeck effect, between a heat absorbing plate, which absorbs heat generated by a candle, and a heat radiating plate, which radiates the absorbed heat, generates thermoelectromotive force using a temperature difference between a contact surface with the heat absorbing plate and a contact surface with the heat radiating plate, emits light using a lighting unit by converting the generated thermoelectromotive force into a constant current at direct current voltage, controls an operational state of the lighting unit based on a result of measuring luminous intensity of a flame of the candle and an inclination of the candle or the lighting apparatus, and maintains a constant distance between an uppermost side of the candle and the heat absorbing plate using a distance measurement sensor and a candle moving unit.

Here, the thermoelectric elements collectively refer to elements that use various effects generated by an interaction between heat and electricity, and include a thermistor which is an element having properties of negative resistance temperature coefficients in which electric resistance is reduced as a temperature becomes higher, an element which uses the Seebeck effect that is a phenomenon in which thermoelectromotive force is generated as carriers in the thermoelectric element moves when there is a temperature difference, and an element which uses the Peltier effect that is a phenomenon in which heat is absorbed or generated due to an electric current.

The Seebeck effect, among the above effects, is one of the thermoelectric effects in which a current (thermoelectric current) flows through a circuit when both ends of two types of metallic wires or semiconductors, which are joined together, are maintained at different temperatures, and the configuration will be more specifically described below.

When there is a temperature difference between both ends A and B of a single metallic bar, thermoelectromotive force is generated because of a heat flow between the both ends A and B. Because the thermoelectromotive force varies in accordance with the type of metal, there occurs a difference in thermoelectromotive force at the metallic bar having both ends at which different types of metal A and B are joined, and as a result, an electric current flows.

The thermoelectric power generation using the Seebeck effect of the thermoelectric element has an effect in that electricity may be generated by a very simple method in which the thermoelectric element is provided within a short distance from the heat source.

DETAILED DESCRIPTION OF THE INVENTION

Technical Problem

The present invention has been made in an effort to solve the above problems, and an object of the present invention is to provide a candle-powered lighting apparatus which is provided with a thermoelectric element between a heat absorbing plate, which absorbs heat generated by a candle, and a heat radiating plate, which radiates the absorbed heat, and generates thermoelectromotive force using a temperature difference between a contact surface with the heat absorbing plate and a contact surface with the heat radiating plate, thereby emitting light using a lighting unit by converting the generated thermoelectromotive force into a constant current at direct current voltage.

In addition, an object of the present invention is to provide a candle-powered lighting apparatus which measures luminous intensity from a flame of the candle using an illuminance sensor, and controls an operational state of a lighting unit to an off state when the measured luminous intensity is a predetermined luminous intensity or lower, thereby controlling the lighting unit to correspond to a state in which the flame of the candle is extinguished.

In addition, an object of the present invention is to provide a candle-powered lighting apparatus which measures a distance between an uppermost side of the candle and a heat absorbing plate using a distance measurement sensor, and vertically moves the candle when the measured distance is not included in a predetermined distance range, thereby maintaining a constant distance between the uppermost side of the candle and the heat absorbing plate.

In addition, an object of the present invention is to provide a candle-powered lighting apparatus which measures an inclination using an inclination sensor, and controls an operational state of the lighting unit to an off state when the measured inclination is a predetermined inclination or less, thereby controlling the lighting unit corresponding to the inclination of the candle or the lighting apparatus.

Technical Solution

The present invention relates to a candle-powered lighting apparatus including: a housing which accommodates a candle; a heat absorbing plate which absorbs heat generated by the candle; a heat radiating plate which radiates the absorbed heat; a thermoelectric element which is positioned between the heat absorbing plate and the heat radiating plate, and generates thermoelectromotive force using a temperature difference between a contact surface with the heat absorbing plate and a contact surface with the heat radiating plate; a lighting unit which emits light using the generated thermoelectromotive force; and a control unit which controls an operational state of the lighting unit to an on or off state.

The candle-powered lighting apparatus may further include a converter which receives and converts the generated thermoelectromotive force into a constant current at direct current voltage.

The candle-powered lighting apparatus may further include an illuminance sensor which is positioned in the housing and measures luminous intensity of light emitted from a flame of the candle.

The control unit may compare the luminous intensity measured by the illuminance sensor with predetermined luminous intensity and determine whether the measured luminous intensity is the predetermined luminous intensity or lower, and when the measured luminous intensity is the predetermined luminous intensity or lower in accordance with the determination result, the control unit may control the operational state of the lighting unit to the off state.

The housing may include a candle support unit which supports the candle at a low side, and a candle moving unit which vertically moves the candle support unit.

The candle-powered lighting apparatus may further include a distance measurement sensor which is positioned in the housing and measures a distance between an uppermost side of the candle and the heat absorbing plate.

The control unit may compare a distance measured by the distance measurement sensor with a predetermined distance range and determine whether the measured distance is included in the predetermined distance range, and when the measured distance is not included in the predetermined distance range in accordance with the determination result, the control unit may control the candle moving unit to vertically move the candle support unit so that the distance between the uppermost side of the candle and the heat absorbing plate is less than the predetermined distance.

The candle-powered lighting apparatus may further include a gravity sensor which measures an inclination of the candle with respect to a ground surface.

The control unit may compare an inclination measured by the gravity sensor with a predetermined inclination and determine whether the measured inclination is the predetermined inclination or less, and when the measured inclination is the predetermined inclination or less in accordance with the determination result, the control unit may control the operational state of the lighting unit to the off state.

The candle-powered lighting apparatus may further include a dimming unit which adjusts brightness of light emitted from the lighting unit.

The candle-powered lighting apparatus may further include a timer which sets an operating time of the lighting unit.

The control unit may control the operational state of the lighting unit to the on or off state based on the set operating time.

The candle-powered lighting apparatus may further include a dust collecting unit which electrically collects floating fine particles by electrically charging the floating fine particles produced during a process of burning the candle.

Advantageous Effects

The present invention has an effect in that the lighting unit emits light by generating electricity with the thermoelectric element by using the candle as a heat source, and as a result, it is possible to emit light with luminous intensity that enables daily usage only by using the candle that can be easily obtained.

In addition, the present invention has an effect in that the lighting unit is controlled corresponding to a state in which a flame of the candle is extinguished, and as a result, electric power consumption of the lighting unit is prevented when electricity is not generated as a supply of thermal energy is cut off from the heat source, thereby preventing unnecessary electric power consumption.

In addition, the present invention has an effect in that the lighting unit is controlled corresponding to a state in which a flame of the candle is extinguished, and as a result, when the user extinguishes the flame of the candle to darken the surrounding environment, the lighting unit may be easily turned off.

In addition, the present invention provides a candle-powered lighting apparatus which maintains a constant distance between the uppermost side of the candle and the heat absorbing plate by vertically moving the candle, thereby efficiently absorbing heat transferred from the candle.

In addition, the present invention has an effect in that the lighting unit is controlled to emit flickering light based on the inclination of the candle or the lighting apparatus, and as a result, it is possible to inform the user of the risk of fire that may be caused by the flame, thereby preventing a fire.

BEST MODE

Figure 1:
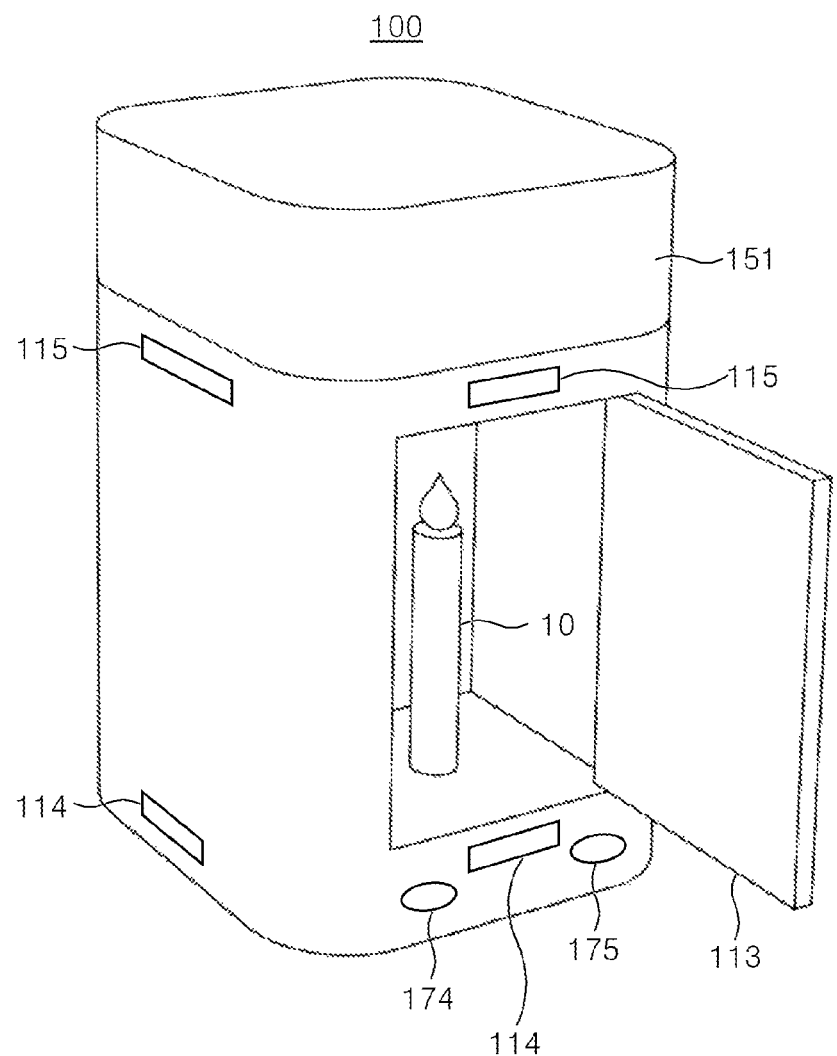
FIG. 1 is a view three-dimensionally illustrating an external shape of a candle-powered lighting apparatus according to an exemplary embodiment of the present invention.
Figure 2:
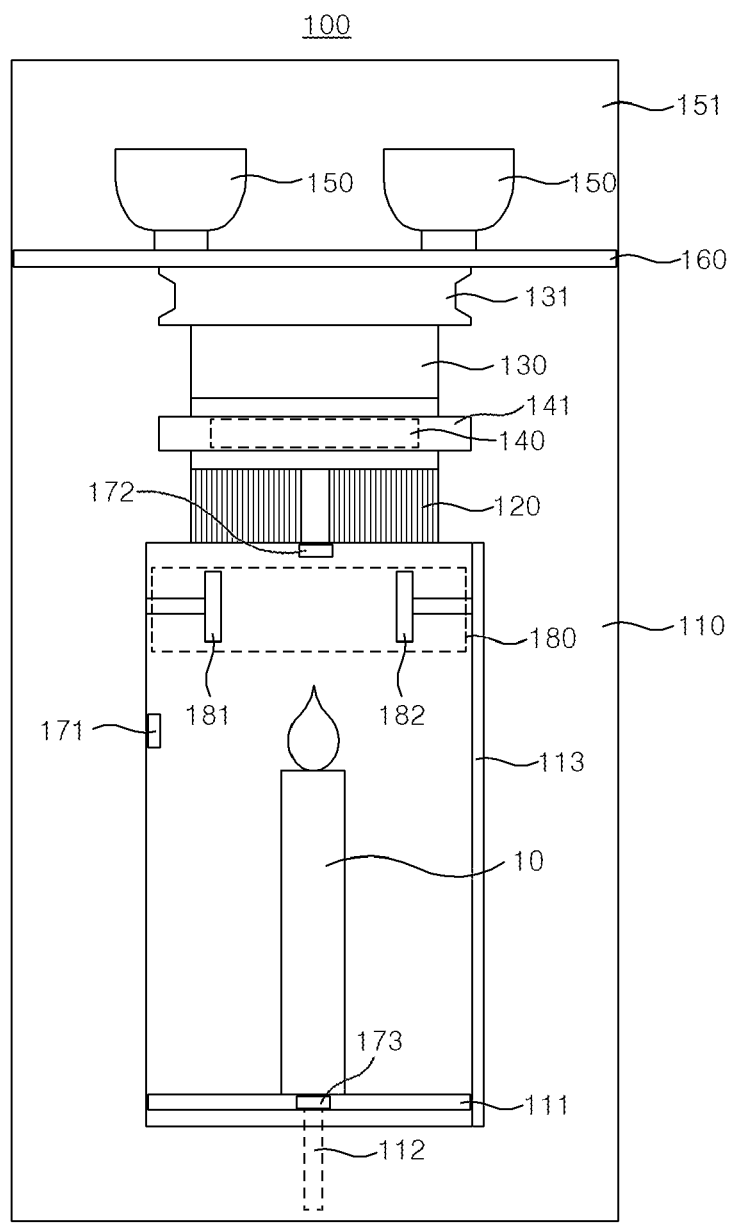
FIG. 2 is a view specifically illustrating a cross section of the candle-powered lighting apparatus according to the exemplary embodiment of the present invention.
Figure 3:
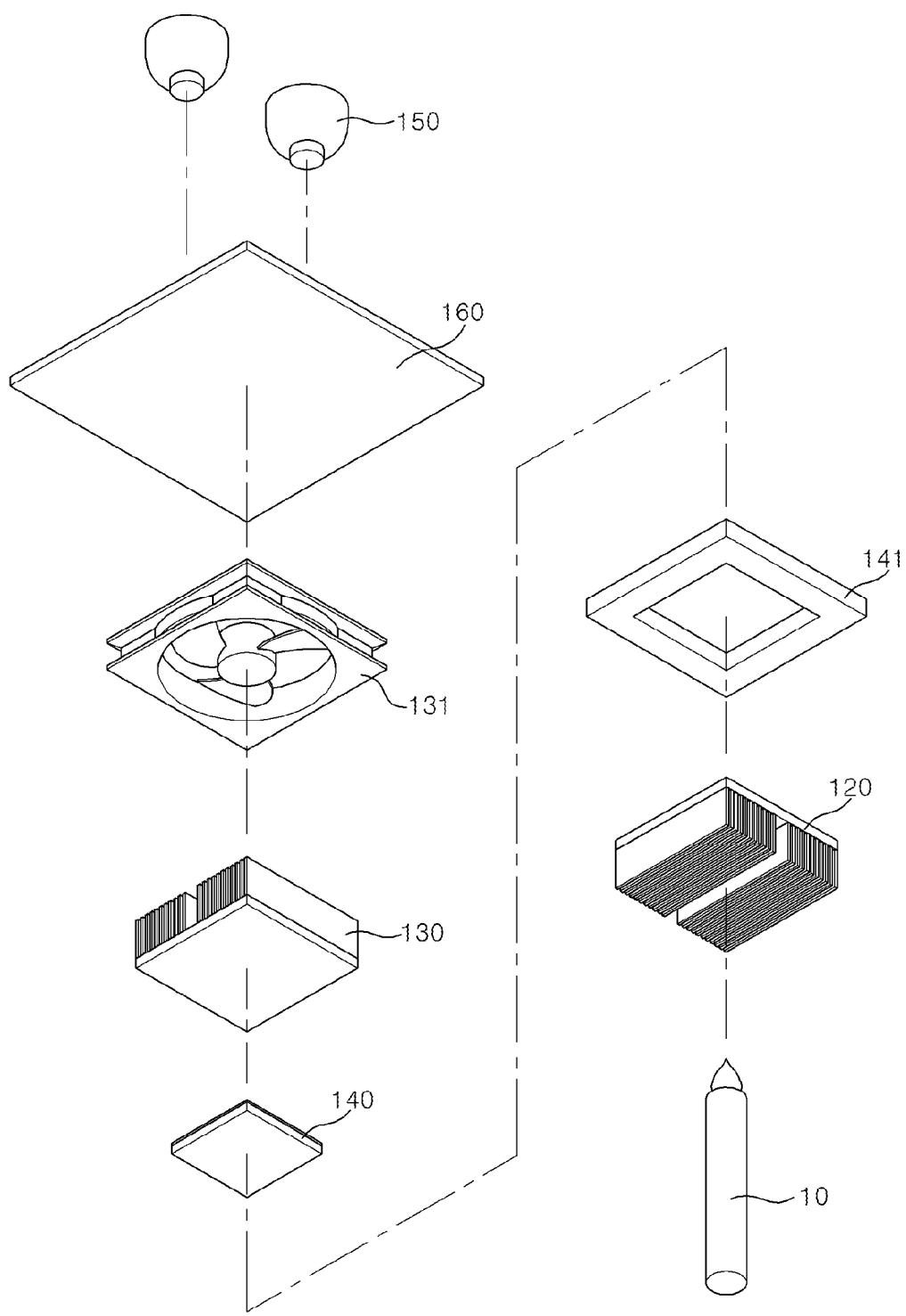
FIG. 3 is a view illustrating, in more detail, main constituent elements of the candle-powered lighting apparatus according to the exemplary embodiment of the present invention.

Exemplary embodiments of a candle-powered lighting apparatus according to the present invention will be described with reference to the accompanying drawings. Here, thicknesses of lines illustrated in the drawings, sizes of constituent elements, or the like may be exaggerated for clarity and convenience of description. In addition, the terms used in the following description are defined considering the functions of the present invention and may vary depending on the intention or usual practice of a user or an operator. Therefore, the definition of the terms should be made based on the entire contents of the present specification.

In addition, unless explicitly described to the contrary, the word "comprise" or "include" and variations, such as "comprises", "comprising", "includes" or "including", will be understood to imply the inclusion of stated constituent elements but not the exclusion of any other constituent elements.

In addition, the term "unit", "part", or the like, which is described in the specification, means a unit that performs one or more functions or operations, and the "unit", "part", or the like may be implemented by hardware, software, or combination of hardware and software.

A candle-powered lighting apparatus 100 according to an exemplary embodiment of the present invention will be described with reference to FIGS. 1 to 4. The candle-powered lighting apparatus 100 includes a housing 110, a heat absorbing plate 120, a heat radiating plate 130, a thermoelectric element 140, a lighting unit 150, and a control unit 160.

The housing 110 accommodates therein a candle 10 to prevent a flame of the candle 10 from being extinguished by a flow of outside air, and serves to secure the heat absorbing plate 120, the heat radiating plate 130, the thermoelectric element 140, and the control unit 160 in the housing 110. To perform the functions of the housing 110, the housing 110 may be made of a heat-resistant material that is not deformed at a high temperature.

In addition, the housing 110 may include a candle support unit 111, a candle moving unit 112, an opening and closing unit 113, an air inlet 114, and an air outlet 115.

The candle support unit 111 may serve to support the candle 10 at a lower side so that the candle 10 may stand on the candle support unit 111. The candle support unit 111, which serves to perform the above functions, may be formed in a plate shape, and may have grooves or concave-convex portions formed at a central portion thereof to support the candle 10 so that the candle 10 does not fall over.

The candle moving unit 112 may be connected to a lower side of the candle support unit 111, which supports the candle 10, and may serve to move the candle support unit 111 vertically. With the candle moving unit 112, the candle 10 supported by the candle support unit 111 may also be moved vertically. To perform the above functions, the candle moving unit 112 may include a motor.

The opening and closing unit 113 may serve to block the inside of the housing 110 from the outside to prevent the flame of the candle 10 from being extinguished. The opening and closing unit 113, which performs the above functions, may be made of a transparent material that blocks a flow of air between the inside and the outside of the housing 110 and allows the interior of the housing 110 to be viewed therethrough.

With the opening and closing unit 113, it is possible to prevent a fire that may be caused by the flame of the candle 10.

The air inlet 114 may be formed in the form of a hole and positioned at a lower end of a lateral side of the housing 110 to serve to supply oxygen, which is used to burn the candle 10, into the housing 110.

The air outlet 115 may also be formed in the form of a hole and positioned at an upper end of the lateral side of the housing 110 to serve to discharge air heated by the flame of the candle 10 from the inside to the outside of the housing 110.

The heat absorbing plate 120 serves to absorb heat from the candle 10 and transfer the heat to the thermoelectric element 140. More specifically, a lower portion of the heat absorbing plate 120 is positioned above the candle 10 to absorb heat generated by the flame of the candle 10, and an upper portion of the heat absorbing plate 120 is in surface-to-surface contact with a lower portion of the thermoelectric element 140, thereby transferring heat absorbed from the flame of the candle 10 to the thermoelectric element 140.

To perform the above functions of the heat absorbing plate 120, the heat absorbing plate 120 may be made of aluminum (Al) or copper (Cu) that has little heat loss and high heat absorbing efficiency and thermal conductivity.

In an exemplary embodiment, the candle-powered lighting apparatus 100 may have a contact plate (not illustrated) having viscosity between the heat absorbing plate 120 and the lower portion of the thermoelectric element 140, thereby securing the heat absorbing plate 120 and the thermoelectric element 140.

The heat radiating plate 130 serves to receive heat from the thermoelectric element 140 and radiate the heat. More specifically, a lower portion of the heat radiating plate 130 is in surface-to-surface contact with an upper portion of the thermoelectric element 140, such that the heat radiating plate 130 may receive heat from the upper portion of the thermoelectric element 140 and then radiate the received heat to the outside of the heat radiating plate 130.

To perform the above functions of the heat radiating plate 130, the heat radiating plate 130 may be made of aluminum or copper that has high heat radiating efficiency and thermal conductivity.

In an exemplary embodiment, the candle-powered lighting apparatus 100 has a fan 131 provided on an upper portion of the heat radiating plate 130 to increase a flow velocity of air flowing at an upper side of the heat radiating plate 130, thereby improving heat radiating efficiency.

Figure 5:
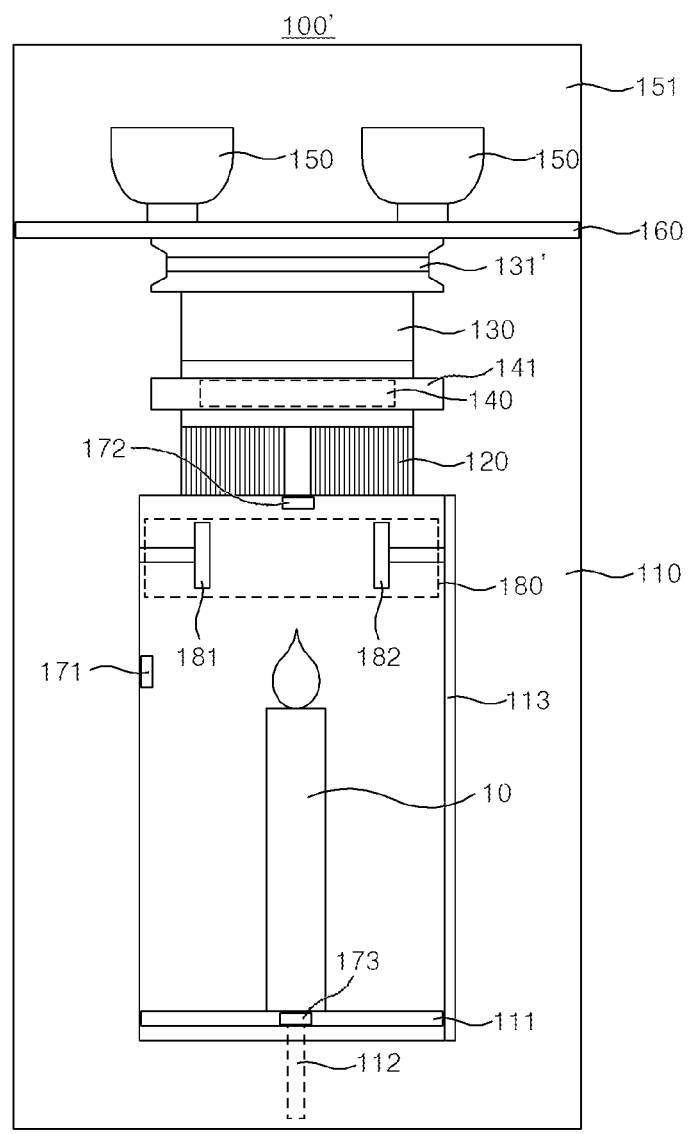
FIG. 5 is a view specifically illustrating a cross section of a candle-powered lighting apparatus according to another exemplary embodiment of the present invention.

In another exemplary embodiment, as illustrated in FIG. 5, a candle-powered lighting apparatus 100' may include a water cooling type cooling unit 131' which is provided on the upper portion of the heat radiating plate 130 and has a coolant flowing therein, instead of the fan 131 that is an air cooling type cooling device. Therefore, the candle-powered lighting apparatus 100' according to another exemplary embodiment cools the heat radiating plate 130 using the water cooling type cooling, thereby improving heat radiating efficiency.

The thermoelectric element 140 generates electricity in accordance with the Seebeck effect that is a phenomenon in which a temperature difference between both ends produces electromotive force, and serves to generate thermoelectromotive force using a temperature difference between a contact surface with the heat absorbing plate 120 and a contact surface with the heat radiating plate 130.

More specifically, the lower portion of the thermoelectric element 140 is in surface-to-surface contact with the upper portion of the heat absorbing plate 120 and may be heated to a high temperature by receiving heat absorbed by the heat absorbing plate 120, and the upper portion of the thermoelectric element 140 is in surface-to-surface contact with the lower portion of the heat radiating plate 130 and may be cooled to a low temperature by transferring heat to the heat radiating plate 130. Therefore, a temperature difference occurs between the lower portion and the upper portion of the thermoelectric element 140, such that the thermoelectric element 140 may generate electricity by generating thermo-electromotive force through the Seebeck effect.

In an exemplary embodiment, in the candle-powered lighting apparatus 100, the thermoelectric element 140 is provided in a quadrangular high-temperature thermal insulator 141 between the heat absorbing plate 120 and the heat radiating plate 130 to prevent the heat absorbing plate 120 and the heat radiating plate 130 from being in direct contact with each other, such that heat absorbed by the heat absorbing plate 120 may be transferred only to the thermoelectric element 140.

The lighting unit 150 serves to emit light using the thermoelectromotive force generated by the thermoelectric element 140. The lighting unit 150 may use a light emitting diode (LED) with high luminous efficiency as a light source, but it is noted that various light sources with high luminous efficiency may be used.

In an exemplary embodiment, the candle-powered lighting apparatus 100 may have a lighting unit cover 151 which protects the lighting unit 150 from external impact and allows light emitted from the lighting unit 150 to pass therethrough to the outside. In this case, the lighting unit cover 151 may be made of a material and a structure which have high light transmittance.

Next, the control unit 160, which controls an operational state of the lighting unit 150 based on sensing results of an illuminance sensor 171, a distance measurement sensor 172, and a gravity sensor 173, will be described.

The control unit 160 serves to control the operational state of the lighting unit 150 to an on or off state depending on luminous intensity measured by the illuminance sensor 171.

More specifically, the illuminance sensor 171 is positioned in the housing 110 and may measure luminous intensity of light emitted from the flame of the candle 10.

The control unit 160 compares the luminous intensity measured by the illuminance sensor 171 with predetermined luminous intensity and determines whether the measured luminous intensity is the predetermined luminous intensity or lower, and in a case in which the measured luminous intensity is the predetermined luminous intensity or lower, the control unit 160 may determine that the flame of the candle 10 is extinguished and then control the operational state of the lighting unit 150 to the off state.

On the contrary, in a case in which the luminous intensity measured by the illuminance sensor 171 exceeds the predetermined luminous intensity, the control unit 160 determines that the flame of the candle 10 is burning, and does not control the operational state of the lighting unit 150.

Here, the predetermined luminous intensity may be luminous intensity which serves as a reference for determining whether the flame of the candle 10 is extinguished. For example, the predetermined luminous intensity may be 0.4 lux.

As such, the control unit 160 controls the operational state of the lighting unit 150 depending on the measurement result of luminous intensity by the illuminance sensor 171, such that in a case in which a user does not need illumination, that is, light, and extinguishes the flame of the candle 10, the control unit 160 may turn off the lighting unit 150 in accordance with the user's intention.

The control unit 160 serves to control the candle moving unit 112 based on a distance measured by the distance measurement sensor 172 to vertically move the candle support unit 111.

More specifically, the distance measurement sensor 172 is positioned in the housing 110 and may measure a distance between an uppermost side of the candle 10 and a lower side of the heat absorbing plate 120. The position of the distance measurement sensor 172 is not restricted as long as the distance measurement sensor 172 measures the distance between the uppermost side of the candle 10 and the lower side of the heat absorbing plate 120.

The control unit 160 compares a distance measured by the distance measurement sensor 172 with a predetermined distance range and determines whether the measured distance is included in the predetermined distance range, and in a case in which the measured distance is not included in the predetermined distance range in accordance with the determination result, the control unit 160 may control the candle moving unit 112 to vertically move the candle support unit 111 so that the distance between the uppermost side of the candle 10 and the lower side of the heat absorbing plate 120 is less than the predetermined distance. Therefore, as the candle support unit 111, which supports the candle 10 at a lower side, is moved vertically, the candle 10 may also be moved vertically.

On the contrary, in a case in which the distance measured by the distance measurement sensor 172 is not included in the predetermined distance range, the control unit 160 does not control the candle moving unit 112.

Here, the predetermined distance range may be a distance range in which heat may be efficiently transferred from the flame of the candle 10 to the heat absorbing plate 120. For example, the predetermined distance range may range from 3 cm to 5 cm.

Figure 4:
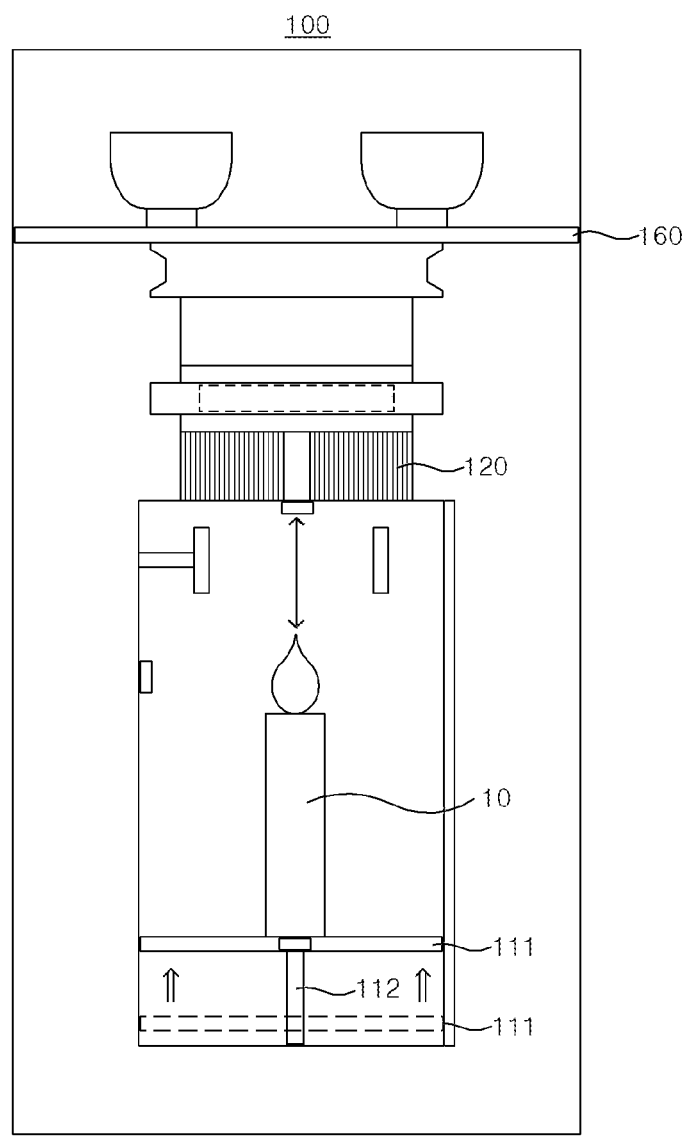
FIG. 4 is a view illustrating a configuration for moving a candle in the candle-powered lighting apparatus according to the exemplary embodiment of the present invention.

As illustrated in FIG. 4, in a case in which the distance between the uppermost side of the candle 10 and the lower side of the heat absorbing plate 120 is out of the predetermined distance range because of the candle 10 having a reduced size, the control unit 160 controls the candle moving unit 112 to move the candle support unit 111 upward, such that the heat absorbing plate 120 may efficiently absorb heat transferred from the flame of the candle 10.

The control unit 160 serves to control the operational state of the lighting unit 150 based on an inclination measured by the gravity sensor 173 so that the operational state of the lighting unit 150 becomes a flickering state in which the lighting unit 150 is repeatedly turned on and off.

More specifically, the gravity sensor 173 may measure an inclination of the candle 10 or the candle-powered lighting apparatus 100 with respect to a ground surface.

The control unit 160 compares the inclination measured by the gravity sensor 173 with a predetermined inclination and determines whether the measured inclination is the predetermined inclination or less, and in a case in which the measured inclination is the predetermined inclination or less, the control unit 160 may determine that the candle 10 or the candle-powered lighting apparatus 100 falls over, and then control the operational state of the lighting unit 150 so that the operational state of the lighting unit 150 becomes a flickering state.

Here, the flickering state may be an operational state in which the lighting unit 150 is repeatedly turned on and off to inform the user that the candle 10 or the candle-powered lighting apparatus 100 has fallen over.

On the contrary, in a case in which the inclination measured by the gravity sensor 173 exceeds the predetermined inclination, the control unit 160 determines that the candle 10 or the candle-powered lighting apparatus 100 has not fallen over, and does not control the operational state of the lighting unit 150.

Here, the predetermined inclination may be an inclination which serves as a reference for determining whether the candle 10 or the candle-powered lighting apparatus 100 has fallen over. For example, the predetermined inclination may be 80 degrees.

As such, the control unit 160 controls the operational state of the lighting unit 150 based on the measurement result of the inclination by the gravity sensor 173, such that it is possible to inform the user of the risk of fire that may be caused by a flame, thereby preventing a fire.

Meanwhile, the control unit 160 may store surplus electricity, which is not used to operate the lighting unit 150 amongst electricity generated by thermoelectromotive force generated by the thermoelectric element 140, in a battery. Therefore, the battery is charged with electricity generated by the thermoelectric element 140 when the lighting unit 150 is not operated, and the control unit 160 may operate the lighting unit 150 only by using electricity stored in the battery.

Next, the control unit 160, which controls the operational state of the lighting unit 150 based on settings inputted by the user through a timer 174, will be described.

The control unit 160 serves to control an operating time of the lighting unit 150 based on an operating time inputted by the user through the timer 174.

More specifically, the timer 174 is provided with an input unit through which the user may input time, and receives the operating time of the lighting unit 150 from the user, and the control unit 160 may control the operational state of the lighting unit 150 to the off state at a point of time at which the inputted operating time has passed. For example, in a case in which one hour is inputted to the timer 174 by the user through the input unit as the operating time of the lighting unit 150, the control unit 160 controls the operational state of the lighting unit 150 to the off state at a point of time at which one hour has passed from a point of time at which the operating time is inputted, such that a dark room may be illuminated by using the candle-powered lighting apparatus 100 for the time desired by the user.

Next, a dimming unit 175, which controls brightness of the lighting unit 150, will be described.

The dimming unit 175 serves to control brightness of the lighting unit 150 based on a brightness setting inputted by the user.

More specifically, the dimming unit 175 is provided with a touch sensor that detects whether the user touches the dimming unit 175, and may control brightness of the lighting unit 150 through a plurality of steps when the touch sensor detects that the user touches the dimming unit 175. For example, the dimming unit 175 divides steps of controlling brightness into four steps of allowing the lighting unit 150 to emit light with brightness that is 25%, 50%, 75%, and 100% of maximum brightness, and may control the brightness of the lighting unit 150 by sequentially changing the respective steps each time the touch sensor detects that the user touches the dimming unit 175.

In another exemplary embodiment, the dimming unit 175 is provided with a rotary dial, and may control brightness of the lighting unit 150 in proportion to a rotation angle of the rotary dial that has been rotated by the user.

The dimming unit 175, which performs the above functions, is provided with variable resistance connected with the lighting unit 150, and may control brightness of the lighting unit 150 by changing resistance values depending on a brightness setting of the lighting unit 150 which is inputted by the user.

Meanwhile, in an exemplary embodiment, the control unit 160 of the candle-powered lighting apparatus 100 may further include a converter (not illustrated) which receives and converts thermoelectromotive force generated by the thermoelectric element 140 into a constant current at a rated voltage which is suitable for the light source of the lighting unit 150. Therefore, various light sources may be used as the light source of the lighting unit 150 in accordance with the user's preference and given conditions.

In this case, the control unit 160 may be a microcontroller unit (MCU) which operates software, such as application programs and applications, through a central processing unit (CPU).

The dust collecting unit 180 may electrically charge floating fine particles produced during a process of burning the candle 10 and electrically collect dust.

In an exemplary embodiment, the dust collecting unit 180 may use a corona discharge type dust collecting method in order to collect floating fine particles harmful to human bodies, such as paraffin wax produced when components of the candle 10 are not refined, and black carbon produced when the candle 10 is incompletely burnt.

To this end, the dust collecting unit 180 may include a dust collecting electrode 181 and a discharge electrode 182 which are installed in the housing 110. In this case, high voltage may be applied to the dust collecting electrode 181 and the discharge electrode 182 by using electricity generated by thermoelectromotive force.

The corona discharge occurs at the discharge electrode 182 due to the applied voltage, and the floating fine particles are electrically charged by the corona discharge and then moved to the dust collecting electrode 181, such that the floating fine particles, which are produced during the process of burning the candle 10, may form a layer of dust.

Therefore, the floating fine particles floating inside the housing 110 are collected at the dust collecting electrode 181 of the dust collecting unit 180 and may be prevented from flowing to the outside of the housing 110.

In this case, the candle-powered lighting apparatus 100 may have an air circulation device such as a fan, which is installed in the housing 110, thereby uniformly purifying air inside the housing 110.

While the exemplary embodiments of the present invention have been described above, it may be understood by those skilled in the art that the present invention may be variously modified and changed without departing from the spirit and scope of the present invention disclosed in the claims.

The invention claimed is:

1. A candle-powered lighting apparatus comprising:
   a housing which accommodates a candle;
   a heat absorbing plate which absorbs heat generated by the candle;
   a heat radiating plate which radiates the absorbed heat;
   a thermoelectric element which is positioned between the heat absorbing plate and the heat radiating plate, and generates thermoelectromotive force using a temperature difference between a contact surface with the heat absorbing plate and a contact surface with the heat radiating plate;
   a lighting unit which emits light using the generated thermoelectromotive force;
   a control unit which controls an operational state of the lighting unit to an on or off state; and an illuminance sensor which is positioned in the housing and measures luminous intensity of light emitted from a flame of the candle.

2. The candle-powered lighting apparatus of claim 1, further comprising:
a converter which receives and converts the generated thermoelectromotive force into a constant current at direct current voltage.

3. The candle-powered lighting apparatus of claim 1, wherein the control unit compares the luminous intensity measured by the illuminance sensor with predetermined luminous intensity and determines whether the measured luminous intensity is the predetermined luminous intensity or lower, and when the measured luminous intensity is the predetermined luminous intensity or lower in accordance with the determination result, the control unit controls the operational state of the lighting unit to the off state.

4. The candle-powered lighting apparatus of claim 1, further comprising:
a timer which sets an operating time of the lighting unit.

5. The candle-powered lighting apparatus of claim 4, wherein the control unit controls the operational state of the lighting unit to the on or off state based on the set operating time.

6. The candle-powered lighting apparatus of claim 1, further comprising: a dimming unit which adjusts brightness of light emitted from the lighting unit.

7. A candle-powered lighting apparatus comprising:
a housing which accommodates a candle;
a heat absorbing plate which absorbs heat generated by the candle;
a heat radiating plate which radiates the absorbed heat;
a thermoelectric element which is positioned between the heat absorbing plate and the heat radiating plate, and generates thermoelectromotive force using a temperature difference between a contact surface with the heat absorbing plate and a contact surface with the heat radiating plate;
a lighting unit which emits light using the generated thermoelectromotive force;
a control unit which controls an operational state of the lighting unit to an on or off state, wherein the housing includes:
a candle support unit which supports the candle at a low side; and
a candle moving unit which vertically moves the candle support unit; and
a distance measurement sensor which is positioned in the housing and measures a distance between an uppermost side of the candle and the heat absorbing plate.

8. The candle-powered lighting apparatus of claim 7, wherein the control unit compares a distance measured by the distance measurement sensor with a predetermined distance range and determines whether the measured distance is included in the predetermined distance range, and when the measured distance is not included in the predetermined distance range in accordance with the determination result, the control unit controls the candle moving unit to vertically move the candle support unit so that the distance between the uppermost side of the candle and the heat absorbing plate is less than the predetermined distance.

9. The candle-powered lighting apparatus of claim 8, further comprising:
a gravity sensor which measures an inclination of the candle with respect to a ground surface.

10. The candle-powered lighting apparatus of claim 9, wherein the control unit compares an inclination measured by the gravity sensor with a predetermined inclination and determines whether the measured inclination is the predetermined inclination or less, and when the measured inclination is the predetermined inclination or less in accordance with the determination result, the control unit controls the operational state of the lighting unit to the off state.

11. A candle-powered lighting apparatus comprising:
a housing which accommodates a candle;
a heat absorbing plate which absorbs heat generated by the candle;
a heat radiating plate which radiates the absorbed heat;
a thermoelectric element which is positioned between the heat absorbing plate and the heat radiating plate, and generates thermoelectromotive force using a temperature difference between a contact surface with the heat absorbing plate and a contact surface with the heat radiating plate;
a lighting unit which emits light using the generated thermoelectromotive force;
a control unit which controls an operational state of the lighting unit to an on or off state; and
a dust collecting unit which electrically collects floating fine particles by electrically charging the floating fine particles produced during a process of burning the candle.

* * * * *